(12) United States Patent
Wong et al.

(10) Patent No.: US 8,489,972 B2
(45) Date of Patent: Jul. 16, 2013

(54) DECODING METHOD AND DECODING DEVICE

(75) Inventors: Dominic Wong, Victoria (AU); Dobrica Vasic, Victoria (AU)

(73) Assignee: NEC Corporation, Tokyo (JP)

( * ) Notice: Subject to any disclaimer, the term of this patent is extended or adjusted under 35 U.S.C. 154(b) by 206 days.

(21) Appl. No.: 13/131,954

(22) PCT Filed: Oct. 9, 2009

(86) PCT No.: PCT/JP2009/067947
§ 371 (c)(1),
(2), (4) Date: May 31, 2011

(87) PCT Pub. No.: WO2010/064496
PCT Pub. Date: Jun. 10, 2010

(65) Prior Publication Data
US 2011/0235757 A1   Sep. 29, 2011

(30) Foreign Application Priority Data
Dec. 2, 2008 (JP) .................................. 2008-906238

(51) Int. Cl.
*H03M 13/03* (2006.01)
(52) U.S. Cl.
USPC ............................ 714/795; 714/796; 714/786
(58) Field of Classification Search
USPC .................................. 714/746, 786, 795, 796
See application file for complete search history.

(56) References Cited

U.S. PATENT DOCUMENTS

| | | | |
|---|---|---|---|
| 5,920,597 A | | 7/1999 | Khayrallah et al. |
| 6,105,158 A | * | 8/2000 | Chen et al. ..................... 714/755 |
| 6,161,210 A | * | 12/2000 | Chen et al. ..................... 714/786 |
| 6,484,285 B1 | * | 11/2002 | Dent ............................. 714/791 |
| 7,478,314 B1 | * | 1/2009 | Cheong et al. ................ 714/794 |
| 7,607,073 B1 | * | 10/2009 | Cheong et al. ................ 714/795 |
| 2012/0151285 A1 | * | 6/2012 | Aue ............................. 714/704 |

FOREIGN PATENT DOCUMENTS

| | | |
|---|---|---|
| CN | 1855732 | 11/2006 |
| JP | 2001506811 | 5/2001 |
| JP | 2010-130271 | 6/2010 |

OTHER PUBLICATIONS

Nam Yul Yu, "Performances of Punctured Tail-Biting Convolutional Codes Using Initial State Estimation," Vehicular Technology Conference, 2008. VTC 2008-Fall. IEEE 68th, vol., no., pp. 1,5, Sep. 21-24, 2008.*

(Continued)

*Primary Examiner* — Cynthia Britt
(74) *Attorney, Agent, or Firm* — Young & Thompson (57) ABSTRACT

A decoding method decodes N received branchwords produced by a convolutional encoder using a tail-biting convolutional code. N received branchwords are in memory. Viterbi updates are performed on a sequence of branchwords. A first encoder determines a state at the end of the third block most likely to have generated the final branchword in the sequence from the best path metric. A Viterbi traceback procedure is performed from that first encoder state at the end of the third block to determine a second encoder state at the start of the third block of branchwords. A Viterbi traceback procedure is performed from that second encoder state at the start of the third block to determine a third encoder state at the start of the second block of branchwords. A derived tail-biting path is output, if the second and third encoder states are identical.

7 Claims, 5 Drawing Sheets

OTHER PUBLICATIONS

Abdallah, R.A.; Seok-Jun Lee; Goel, M.; Shanbhag, N.R., "Low-power pre-decoding based viterbi decoder for tail-biting convolutional codes," Signal Processing Systems, 2009. SiPS 2009. IEEE Workshop on , vol., no., pp. 185,190, Oct. 7-9, 2009.*
International Search Report, PCT/JP2009/067947 dated Dec. 22, 2009.
Rose Y. Shao, Shu Lin, and Marc P.C. Fossorier; Two Decoding Algorithms for Tailbiting Codes, Communications, IEEE Transactions on, Oct. 2003, vol. 51, Issue:pp. 1658-1665.
Tadashi Sato, Hideki Yagi, and Shigeichi Hirasawa; Complexity Reduction Method of Suboptimal Maximum Likelihood Decoding Algorithms for Tail-Biting Convolutional Codes, IEICE technical report. Information theory, Jul. 22, 2004, vol. 104, No. 229, pp. 41-46.
Chinese Official Action—200980147990.9—Apr. 3, 2013.
Japanese Official Action—2011-524036—May 28, 2013.
Howard H. Ma et al., On Tail Biting Convolutional Codes, Communications, IEEE Transactions on, Feb. 1986, vol. 34, No. 2, pp.

* cited by examiner

DECODING METHOD AND DECODING DEVICE

TECHNICAL FIELD

The present invention relates to the decoding of general codes produced by a convolution encoder using a tail-biting convolutional code.

BACKGROUND ART

In recent years, when information signals are communicated from a transmitter to a receiver via a communications channel, the information signals may be corrupted by noise associated with the channel. To help prevent such noise from corrupting the received information, a channel coding technique may be employed. Generally, coding which helps mitigate the effects of channel noise does so by introducing redundancy into the information to the communicators. Because of this redundancy, the likelihood that noise will corrupt communicated information is reduced.

Convolutional codes are a class of channel codes used to mitigate the effects of channel noise in the transmission of information. Convolutional codes are well known in the art and have been adopted as standards for certain types of communication systems. One such convolutional code is known in the art as a tail-biting convolutional code.

With tail-biting convolutional codes, a frame or block of information is encoded and communicated in a block-wise manner. The term "tail-biting" is used to refer to the fact that the encoder begins and ends in the same encoder state. The decoder is aware that the encoder begins and ends in the same state but is unaware of the value (or identity) of that state.

The maximum likelihood decoder for the convolutional codes is known in the art as a Viterbi decoder. As is well known, the Viterbi decoder treats the problem of decoding a sequence of received symbols as a problem of finding the most likely sequence of uncorrupted symbols given an actual corrupted sequence received. The maximum likelihood decoder for tail-biting convolutional code employs Viterbi decoding, but can place great demands on computational resources. Alternatively, if computational resources are minimised, the accuracy of the Viterbi decoding can suffer.

DISCLOSURE OF INVENTION

The present invention seeks to solve one or more of the above problems, or to improve upon those problems at least in part.

In one embodiment of the invention, there is provided a decoding method of decoding N received branchwords produced by a convolutional encoder using a tail-biting convolutional code, comprising: storing the N received branchwords in memory; successively performing Viterbi updates on a sequence of branchwords, the sequence comprising a first block comprising S consecutive branchwords from the N received branchwords, a second block comprising the N received branchwords, and a third block comprising T consecutive branchwords from the N received branchwords, where S and T are less than N, and where the Viterbi updates generate updated path metrics; determining a first encoder state at the end of the third block most likely to have generated the final branchword in the sequence from the best path metric; first performing a Viterbi traceback procedure from that first encoder state at the end of the third block to determine a second encoder state at the start of the third block of branchwords; second performing a Viterbi traceback procedure from that second encoder state at the start of the third block to determine a third encoder state at the start of the second block of branchwords; and outputting a derived tail-biting path, if the second and third encoder states are identical.

In another embodiment of the invention, if the second and third encoder states are not identical, then the method may further comprise: replacing the second encoder state with the third encoder state; repeating the second performing; and outputting the derived tail biting path.

Conveniently, the sequence of branchwords in the successively performing may be formed from a logically circular reading of the N received branchwords stored in the memory.

In still another embodiment of the invention, S may equal T.

Conveniently, the first block may comprise S consecutive branchwords from the end of the second block of N received branchwords.

Moreover, the third block may comprise T consecutive branchwords from the start of the second block of N received branchwords.

Another aspect of the invention provides a decoding device of decoding N received branchwords produced by a convolutional encoder using a tail-biting convolutional code, comprising: a memory storing the N received branchwords; and a data processing unit comprising: successively performing unit which successively performs Viterbi updates on a sequence of branchwords, the sequence comprising a first block comprising S consecutive branchwords from the N received branchwords, a second block comprising the N received branchwords and a third block comprising T consecutive branchwords from the N received branchwords, where S and T are less than N, and where the Viterbi updates generate updated path metrics; determining unit which determines a first encoder state at the end of the third block most likely to have generated the final branchword in the sequence from the best path metric; first performing unit which performs a Viterbi traceback procedure from that first encoder state at the end of the third block to determine a second encoder state at the start of the third block of branchwords; second performing unit which performs a Viterbi traceback procedure from that second encoder state at the start of the third block to determine a third encoder state at the start of the second block of branchwords; and outputting unit which outputs a derived tail-biting path, if the second and third encoder states are identical.

BRIEF DESCRIPTION OF THE DRAWINGS

Other features and advantages of the present invention will appear from the following description taken as a non limiting example with reference to the following drawings in which.

BEST MODE FOR CARRYING OUT THE INVENTION

For the purpose of clarity of the following description, identical features and steps in the drawings illustrating the related art and those illustrating the present invention will be given the same reference numbers.

Figure 1:
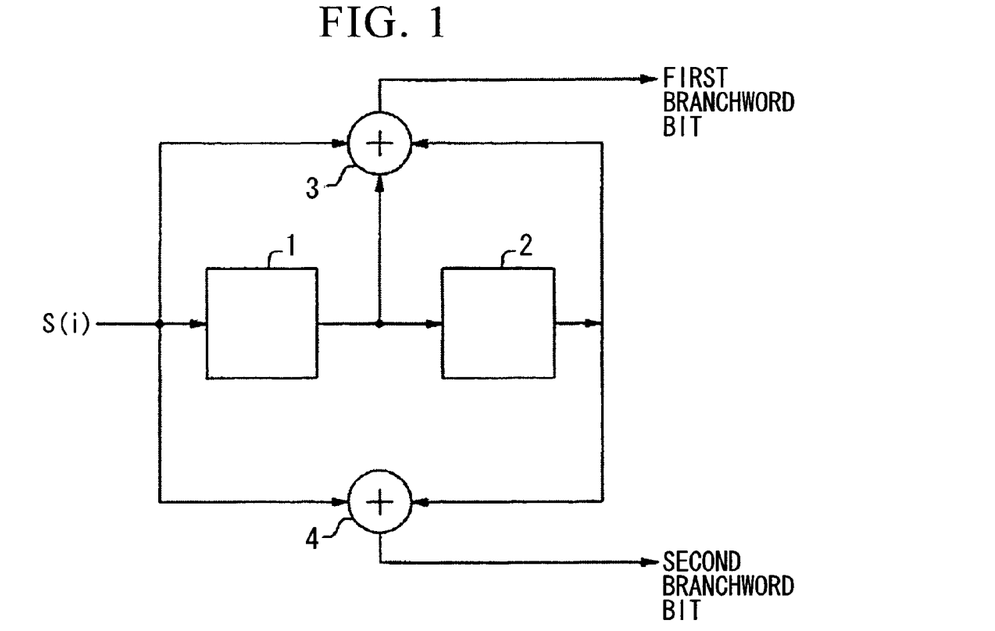
FIG. 1 depicts a related convolutional encoder.

FIG. 1 depicts an illustrative convolutional encoder having a rate of 1/2, namely for every information bit to be coded, the encoder produces two output bits (i.e. a two-bit branchword). The encoder 10 comprises two single bit memory cells 12 and 14 and two adder circuits 16 and 18. The memory cell 12 and adder circuits 16 and 18 receive a sequence of information bits s(i) to be encoded. The memory cell 12 provides its contents to memory cell 14 with each new information bit received. The encoder may be viewed as comprising an "upper" and "lower" path, each path including an adder circuit and connections to the information bit stream and one or both memory cells 12 and 14.

The output of the upper path of the encoder (i.e. the path which includes the adder circuit 16) comprises a first bit of a generated branchword. This output is generated by adding together the current bit and the two previous bits. If the resulting sum is odd, the adder 16 outputs a logical 1; if the resulting sum is even, the adder 16 outputs a logical 0. The output of the "lower" path (the path which includes the adder circuit 18) comprises the second bit of the branchword. This output is generated by adding together the current bit and the bit which is two bits earlier than the current bit. Again, if the resulting sum is odd, the adder 18 outputs a logical 1; if the resulting sum is even, the adder 18 outputs a logical 0. Since only three bits are used to determine an output branchword, this encoder is said to have a constraint length of three. Its memory is two. The more output bits per input bit and the longer the constraint length, the more powerful the code—that is, the more robust the code will be to channel noise.

It will be appreciated that the encoder depicted in FIG. 1 is exemplary only, and that in practical embodiments of the invention a greater number of memory cells and adder circuits may be used to generate a greater number of bits output for each branchword by the encoder.

Figure 2:
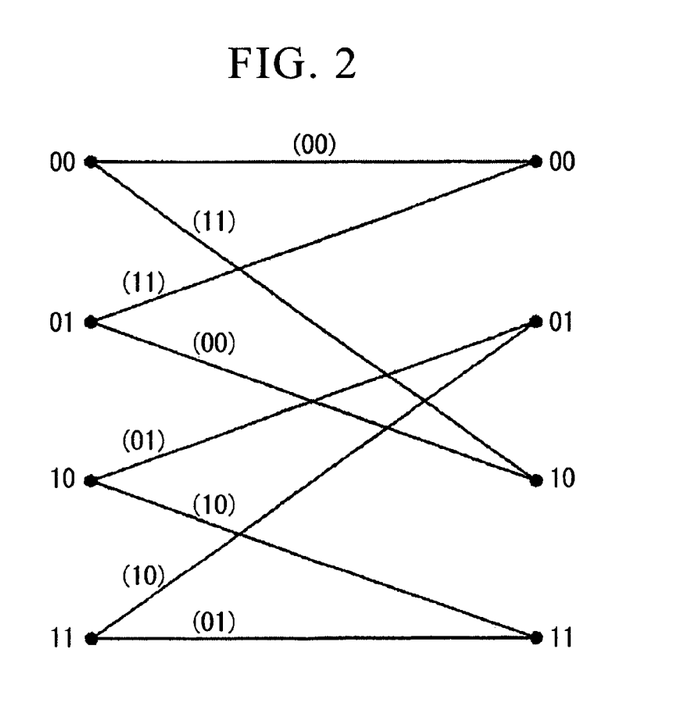
FIG. 2 presents a single state—transition trellis section reflecting the operation of the encoder shown in FIG. 1.

The operation of the convolutional encoder shown in FIG. 1 may be represented conventionally by a treliis diagram such as that presented in FIG. 2. The trellis describes how the states of the encoder can change from one information bit time to the next. The encoder state is simply the contents of the encoder memory cells at any one time read as a state "word". On both the left and right sides of the trellis are the allowable states of the encoder: 00, 01, 10 and 11. The states on the left side of the trellis represent the current state of the encoder. The states on the right side of the trellis represent the next state of the encoder.

For example, regardless of the value of the current bit, if the two previous bits are both 0 (such that the contents of the memory cells 12 and 14 are both 0), the encoder is said to be in state 00 (which is the trellis node in the top left hand corner of the trellis). If the current bit is a 1, the arrival of the next subsequent bit will mean that the encoder transitions to state 10. That is, with the arrival of the next bit, the bit in the memory cell 14 is replaced by the bit in the memory cell 12 (0) and the bit in the memory cell 12 is replaced by a current bit (1). This transition is indicated by the diagonal line beginning at the current state 00 at the top left of the trellis and extending downwards and across to the next state 10. The second state from the bottom on the left side of the trellis. With this state transition is an indication (in parenthesis) of the output branchword of the encoder—in this case, 11.

Figure 3:
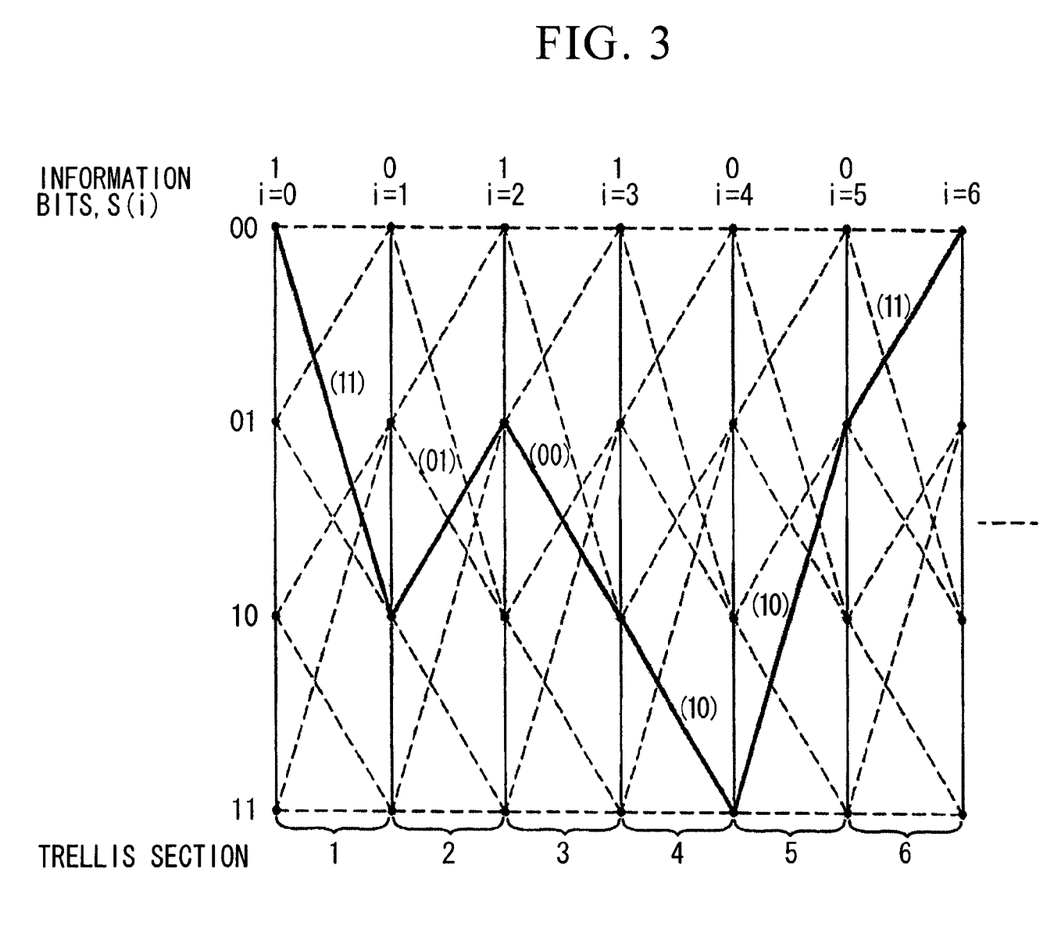
FIG. 3 depicts a state transition trellis showing the operation of the encoder of FIG. 1 given a particular starting state and information bits for coding.

If the current bit was 0 instead of 1, the arrival of the next subsequent bit would mean that the encoder transitions to the same state, 00 (as shown in the horizontal line across the top of the trellis). The trellis diagram indicates all allowable transitions in state by the encoder. According to the diagram shown in FIG. 2, for example, the encoder cannot transition from state 00 to state 11 (not the absence of a line connecting 00 on the left with 11 on the right). This may be seen directly from the fact that states change one bit at a time. Multiple trellises of the type shown in FIG. 2 are concatenated together (as is conventional) to form a trellis indicating a sequence of encoder state transitions over time. The trellis shown in FIG. 3 represents the encoding of the information bit sequence 101100 . . . by an encoder starting in state 00. The trellis comprises six individual trellis sections of the type shown in FIG. 2. In the example shown in FIG. 3, the input bit stream causes the change of states indicated by the solid line, starting with state 00; 10, 01, 10, 11, 01, 00 . . . . Discrete time i is indicated across the top of the trellis. The encoder outputs the branchwords shown in parentheses: 11, 01, 00, 10, 10, 11 . . . . Each of the state transitions indicated by the solid line traversing a trellis section is an allowed transition corresponding to a given current state and an information bit to encode. Other potential allowed state transitions are shown in dashed lines.

As can be seen from FIG. 3, for any given state in a trellis at a particular moment in time, there are two predecessor states from which a transition to the given state can possible occur. This can be seen from either FIG. 2 or 3 where the state on the right side of a trellis section is associated with two states on the left side of the section by two transition paths. Moreover, given a particular starting state, any particular stream of information bits to be encoded will result in a unique path through the trellis. These two points provide the basis for the application of Viterbi decoding of branchwords produced by a convolutional encoder.

Code words generated by the illustrative encoder shown in FIG. 1 are communicated through a communication channel to a decoder. The job of the decoder is to determine the sequence of information bits which were coded by the encoder. A determination is based on branchwords received by the decoder. Assuming a perfect communication channel and knowledge of the encoders starting state, this task is relatively straight forward. The decoder employs a trellis of a type descriptive of the state transitions of the encoder current and, knowing the starting state, uses the received branchwords to dictate state transitions taken by the encoder when encoding. Based on these state transitions, the sequence of bits causing such transitions may be determined.

As a general matter, perfect communication channels are not encountered in the real world. Therefore, real decoders must be able to cope with the fact that some of the branchwords received contain bit errors. For example, while the encoder may generate a branchword 00, the decoder may receive a branchword 01. Thus, the decoder can be misled in its knowledge of the sequence of states taken by the encoder. Contrary to a related Viterbi encoder where the encoder's starting and ending states are always equal to zero, a tail-biting viterbi decoder is not aware of the encoder's starting state and ending states. The only knowledge that a tail-biting viterbi decoder has is the encoder's starting and ending states shall be identical ideally. With imperfect knowledge of the encoder's starting state and the sequence of subsequent states, however, the decoder may make errors in determining encoder information bits.

As is well known in the art, the problem of channel errors are mitigated with the use of Viterbi decoder. A Viterbi decoder selects the most likely path through a coder trellis given branchwords which may contain bit errors. It can do so from any of a number of starting states (assuming the decoder has no knowledge of starting state). The selection of the most likely path is made progressively, one received branchword at a time. As a result of applying the Viterbi technique to each successive, received branchword, a path metric is maintained which reflects a likelihood that a path associated with that metric is the path actually taken by the encoder.

As part of the determination of the best estimate of the path taken by the encoder, a decision vector is generated which reflects for each state (at a given discrete time) which of two possible paths coming into the state is the better path. The vector records the "better path" decision for each state in the trellis. Paths which are not selected as a better path are said to be in "pruned". Pruned paths will not have an effect on the final decoding of the branchwords. In a real world environment, channel symbols are corrupted by noise and interference. In order to provide more decoding information to the Viterbi decoder, soft received branchwords are used to calculate the branch and path metrics for the path selection. These soft received branchwords are real numbers. The term branchword(s) in the following discussion assumes soft branch words.

There are at most two paths which may enter a state. Therefore, the decision on which path to maintain and which path to prune may be represented by a single bit, as is conventional. In the illustrative embodiment of the encoder shown in FIGS. 1 and 2, there are four states at each discrete point in time. Thus, at each such time, a decision vector of four bits is determined and saved in memory. Once the Viterbi technique has been applied to the received branchwords, the saved decision vectors provide the basis for a related Viterbi traceback procedure. It is this traceback procedure which decodes the received branchwords. Further details of convention Viterbi decoding are presented in Clark and Cain, in Air-correction Coding for Digital Communications, Chapter 6 (1981), which is hereby incorporated by reference in its entirety.

Figure 4:
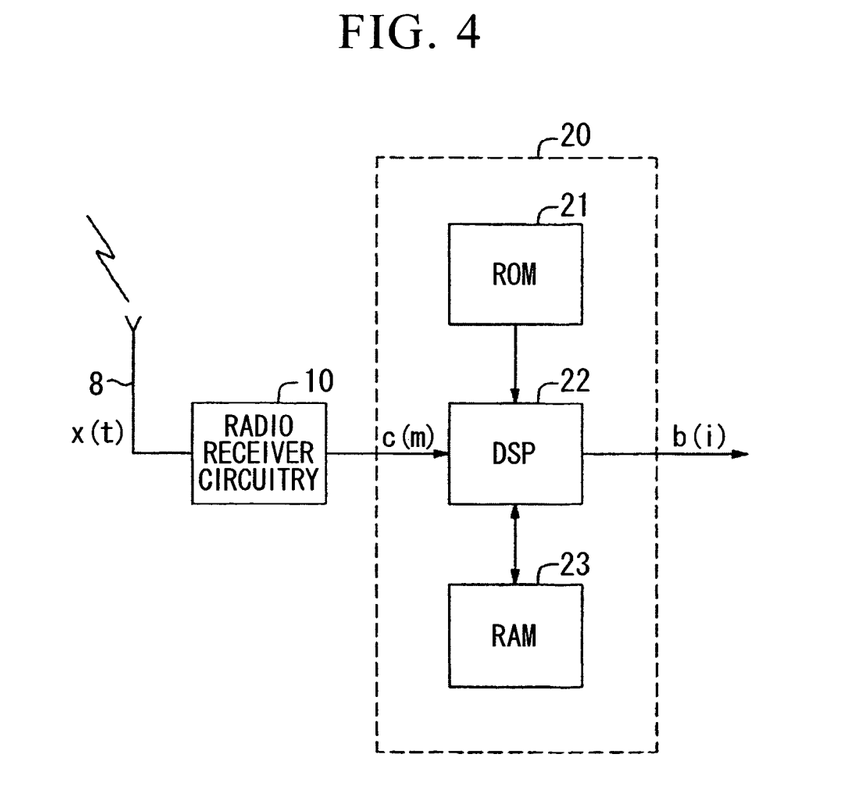
FIG. 4 depicts an exemplary radio receiver system including a digital signal processor which acts to decode received branchwords produced by the encoder shown in FIG. 1.

FIG. 4 depicts an illustrative embodiment of a Viterbi decoder 20 forming part of a radio receiver system. The decoder 20 is coupled to an antenna 22 and radio receiver circuitry 24 which receives an analogue radio signal x(t) and provides to the decoder 20 digital branchwords at discrete times c(i).

The decoder 20 comprises a Digital Signal Processor (DSP) 26 coupled to a Read Only Memory (ROM) 28 and Random Access Memory (RAM) 30. The RAM 30 stores, inter alia, a buffer of N received branchwords for use by the present invention, as well as the results of Viterbi updates.

The decoder 20 operates to decode branchwords c(i) received from the radio communication channel. These branchwords are generated by an encoder employing a tail-biting convolutional code. Such an encoder may be that described above with respect to FIGS. 1 and 2. Because the channel is noisy, the branchwords are imperfectly communicated. That is, the branchwords may contain one or more bit errors. The decoding operation carried out by the decoder 20 attempts to extract the communicator's information from these branchwords.

The decoder 20 employers related Viterbi decoding to decode a block of N received branchwords produced by a convolutional encoder using a tail-biting convolutional code. However, it performs this decoding by successively performing Viterbi updates on a sequence of branchwords which is longer than the N received branchwords produced by the convolutional encoder. The sequence of branchwords on which the Viterbi updates are successively performed is constructed by adding a block of branchwords to the start of the N received branchwords and another block of branchwords to the end of N received branchwords.

Figure 5:
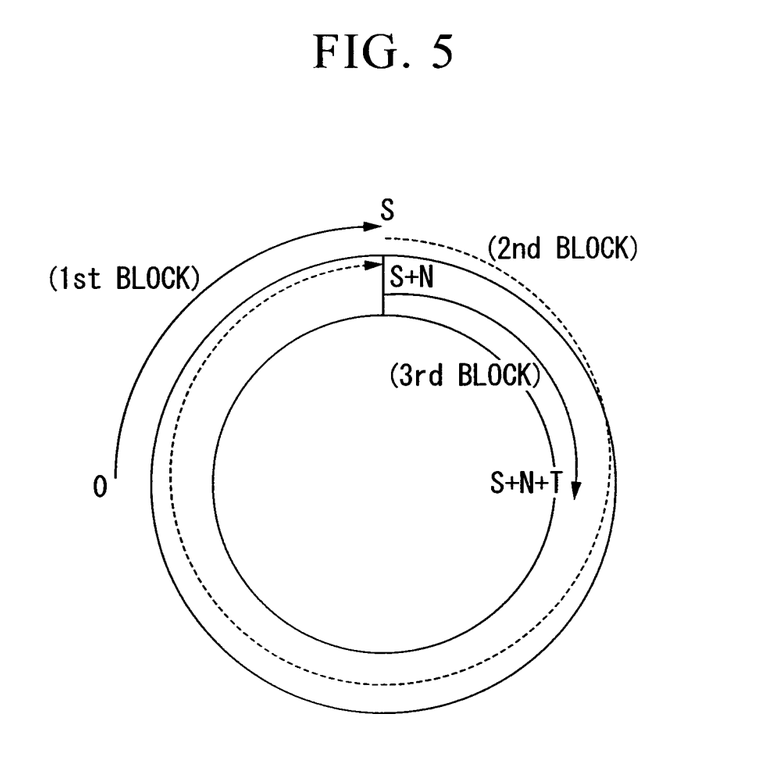
FIG. 5 depicts the manner in which a block of received branchwords is stored in a memory device forming part of the radio receiver shown in FIG. 4.

Preferably, this is done in the manner depicted in FIG. 5. As can be seen in this figure, the sequence of branchwords may be formed from a logically circular reading of the N received branchwords stored in the RAM 30. A first block consisting of S consecutive branchwords from the N received branchwords may be read from the end of the block of N received branchwords stored in the RAM 30. Similarly, a block of T consecutive branchwords may be read from the start of the block of N received branchwords stored in the RAM 30. By first reading a first block 40 of S consecutive branchwords from the N received branchwords, then reading a second block 42 consisting of N received branchwords and finally reading a third block 44 consisting of T consecutive branchwords from the start of the second block of N received branchwords, the sequence of branchwords on which the Viterbi updates are successively performed can be constructed in a manner which is computationally simple to perform. Each Viterbi update generates path metrics and a decision vector based on those metrics as described previously.

In the present context of Viterbi decoding, the decoder 20 makes use of the following principle. If we start accumulating branch metrics along the paths through the trellis shown in FIG. 3, the following observations hold: whenever two paths merge into one state, only the most likely path (the best path or the survivor path) needs to be retained, since for all possible extensions to these paths, the path which is currently better will always be better. For any given extension to the paths, both paths are extended by the same branch metrics. This process is described by the add-compare-select (ACS) recursion, the path with the best path metric leading to every state is determined recursively for every step in the trellis.

Figure 6:
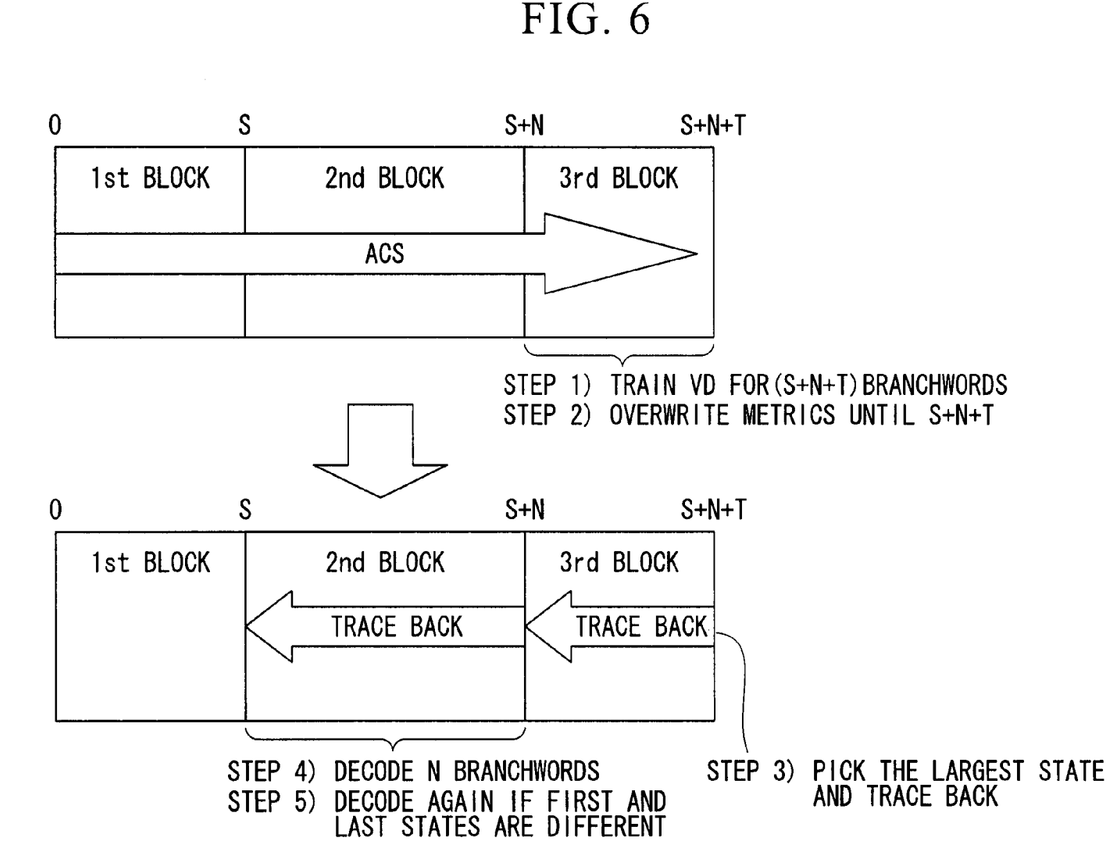
FIG. 6 is a flow chart depicting the sequence of operations performed by the digital signal processor forming part of the radio receiver shown in FIG. 4 during decoding of the block of received branchwords produced by the encoder shown in FIG. 1.

Accordingly, as shown in FIG. 6, the decoder 20 successively performs Viterbi updates on the sequence of N+S+T branchwords which have been read from the RAM 30 in the manner depicted in FIG. 5. The Viterbi updates generate path metrics which are updated for each branchword until the end of the sequence of N+S+T branchwords is reached.

At this point, the decoder 20 determines a first encoder state most likely to have generated the final branchword in the sequence from the best path metric. A Viterbi traceback procedure is then performed from that first encoder state to determine a second encoder state at the start of the third block of branchwords 44. Starting from that second encoder state, a second Viterbi traceback procedure is then performed from the end of the second block 42 of branchwords to the start of the second block 42 of branchwords in order to determine a third encoder state.

If the second and third encoder states are found to be identical (i.e. if the starting state and the ending state of the Viterbi traceback procedure performed on the second block 42 of branchwords) are found to be identical, then the best tail-biting path has been found by the decoder 20.

If the second and third encoder states are not identical then optionally the decoder 20 can repeat the Viterbi traceback procedure performed on the second block 42 of branchwords by replacing the second encoder state with the third encoder state, and repeating the traceback procedure. The derived tail-biting path is then output. It has been found that further iterations of the Viterbi traceback procedure are generally not required.

Conveniently, the values of S and T are identical, that is, the first and third blocks consist of the same number of branchwords forming a subset of the N received branchwords stored in the RAM 30. In other embodiments of the invention though, the first and third block of branchwords may include differing numbers of branchwords.

The above described method of decoding N received branchwords produced by a convolutional encoder using a tail-biting convolutional code advantageously provides more reliable path metrics for use during a Viterbi traceback procedure by lengthening the sequence of branchwords on which Viterbi updates are performed. It has been found that the best tail-biting path is found using this method by performing only one traceback procedure on the second block of N received branchwords, or at most two traceback procedures. Moreover, the manner in which the sequence of branchwords is constructed as depicted in FIG. 5 is computationally very simple to perform, so that the improved accuracy of the above described method is achieved with minimal additional computational resources.

Although in the above described embodiments the invention is implemented primarily using digital signal processing, in other embodiments the present invention may be implemented primarily in hardware using, for example, hardware components such as an application specific integrated circuit. The present invention may also be implemented primarily using computer software or a combination of both hardware and software.

While the present invention has been particularly shown and described with reference to exemplary embodiments thereof, the present invention is not limited to these embodiments. It will be understood by those of ordinary skill in the art that various changes in form and details may be made therein without departing from the spirit and scope of the present invention as defined by the claims.

This application is based upon and claims the benefit of priority from Australian provisional patent application No. 2008906238, filed on 2 Dec. 2008, the disclosure of which is incorporated herein in its entirety by reference.

INDUSTRIAL APPLICABILITY

According to the present invention, it is possible to provide a method of decoding tail-biting convolutional codes employing Viterbi decoding which minimises the demands placed upon memory storage and computational resources, while optimising the accuracy of such decoding.

The invention claimed is:

1. A decoding method of decoding N received branchwords produced by a convolutional encoder using a tail-biting convolutional code, comprising:
storing the N received branchwords in memory;
successively performing Viterbi updates on a sequence of branchwords, the sequence comprising a first block comprising S consecutive branchwords from the N received branchwords, a second block comprising the N received branchwords, and a third block comprising T consecutive branchwords from the N received branchwords, where S and T are less than N, and where the Viterbi updates generate updated path metrics;
determining a first encoder state at the end of the third block most likely to have generated the final branchword in the sequence from the best path metric;
first performing a Viterbi traceback procedure from that first encoder state at the end of the third block to determine a second encoder state at the start of the third block of branchwords;
second performing a Viterbi traceback procedure from that second encoder state at the start of the third block to determine a third encoder state at the start of the second block of branchwords; and
outputting a derived tail-biting path, if the second and third encoder states are identical.

2. The decoding method according to claim 1, wherein if the second and third encoder states are not identical, then the method further comprises:
replacing the second encoder state with the third encoder state;
repeating the second performing; and
outputting the derived tail biting path.

3. The decoding method according to claim 1, wherein the sequence of branchwords in the successively performing is formed from a logically circular reading of the N received branchwords stored in the memory.

4. The decoding method according to claim 1, wherein S equals T.

5. The decoding method according to claim 1, wherein the first block comprises S consecutive branchwords from the end of the second block of N received branchwords.

6. The decoding method according to claim 1, wherein the third block comprises T consecutive branchwords from the start of the second block of N received branchwords.

7. A decoding device of decoding N received branchwords produced by a convolutional encoder using a tail-biting convolutional code, comprising:
a memory storing the N received branchwords; and
a data processing unit comprising:
a successive performing unit which successively performs Viterbi updates on a sequence of branchwords, the sequence comprising a first block comprising S consecutive branchwords from the N received branchwords, a second block comprising the N received branchwords and a third block comprising T consecutive branchwords from the N received branchwords, where S and T are less than N, and where the Viterbi updates generate updated path metrics;
a determining unit which determines a first encoder state at the end of the third block most likely to have generated the final branchword in the sequence from the best path metric;
a first performing unit which performs a Viterbi traceback procedure from that first encoder state at the end of the third block to determine a second encoder state at the start of the third block of branchwords;
a second performing unit which performs a Viterbi traceback procedure from that second encoder state at the start of the third block to determine a third encoder state at the start of the second block of branchwords; and
an outputting unit which outputs a derived tail-biting path, if the second and third encoder states are identical.

* * * * *

UNITED STATES PATENT AND TRADEMARK OFFICE
CERTIFICATE OF CORRECTION

PATENT NO. : 8,489,972 B2
APPLICATION NO. : 13/131954
DATED : July 16, 2013
INVENTOR(S) : Wong et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 179 days.

Signed and Sealed this
Eighth Day of September, 2015

Michelle K. Lee
*Director of the United States Patent and Trademark Office*